(12) United States Patent
Merolla

(10) Patent No.: US 8,427,434 B1
(45) Date of Patent: Apr. 23, 2013

(54) ELECTRONIC LINEAR PERSPECTIVE DRAWING AID

(76) Inventor: Alfred F. Merolla, Stroudsburg, PA (US)

( * ) Notice: Subject to any disclaimer, the term of this patent is extended or adjusted under 35 U.S.C. 154(b) by 1159 days.

(21) Appl. No.: 12/265,524

(22) Filed: Nov. 5, 2008

Related U.S. Application Data

(60) Provisional application No. 60/985,529, filed on Nov. 5, 2007.

(51) Int. Cl.
*G06F 3/041* (2006.01)

(52) U.S. Cl.
USPC .................................. 345/173; 178/18.01

(58) Field of Classification Search .................... 345/76, 345/82, 173, 176, 179, 183, 419; 178/18.01, 178/19.04, 19.05; 382/188, 189; 715/701–702
See application file for complete search history.

(56) References Cited

U.S. PATENT DOCUMENTS

| | | | | |
|---|---|---|---|---|
| 7,015,901 | B2 * | 3/2006 | Lapstun et al. | 345/179 |
| 7,907,167 | B2 * | 3/2011 | Vesely et al. | 348/51 |
| 7,929,751 | B2 * | 4/2011 | Zhang et al. | 382/154 |
| 8,091,787 | B2 * | 1/2012 | Silverbrook et al. | 235/454 |

* cited by examiner

*Primary Examiner* — Abbas Abdulselam
(74) *Attorney, Agent, or Firm* — Clinton H. Wilkinson; Charles A. Wilkinson

(57) ABSTRACT

An electronic linear perspective drawing tool and system particularly designed to draw and paint linear perspective, utilizing a graphic computer system with a transparent organic light-emitting diode (TOLED) display and a drawing input device, which may preferably be a haptic device or a stylus used in combination with a pressure sensitive touch screen, whereby the TOLED serves as an electronic window and drawing canvas that is interposed between the scene to be drawn and the eye of the artist so that the drawing input device can be used to create an artistic rendering on the electronic canvas or screen overlay.

12 Claims, 4 Drawing Sheets

ELECTRONIC LINEAR PERSPECTIVE DRAWING AID

CROSS REFERENCE TO RELATION APPLICATION

This application claims the benefit of provisional application 60/985,529 filed on Nov. 5, 2007, the disclosure of which is hereby incorporated by reference in its entirety.

BACKGROUND OF THE INVENTION

1. Field of the Invention

The present invention is in the general field of drawing aids and tools for use by artists, and more particularly to an electronic linear perspective drawing apparatus and apparatus.

2. Preliminary Discussion

Traditionally, artists have drawn or painted on a canvass made of paper or cloth, using various tools such as drawing pencils, pens, brushes, charcoal, water or oil based is paints, and various other tools. Depending on these varieties of tools and artifacts, as well as the various techniques and processes used in creating a fine piece of artwork, the artists' unique perspectives, impressions and imaginations are brought out on the canvas, which may or may not directly correspond with reality. As a result of such variety of tools and techniques, truly there is no limit to the varieties and forms of visual arts, not withstanding the individual creativity of the artist.

Perspective is a drawing practice for representing three-dimensional objects on a two-dimensional or flat surface. Leonardo da Vinci, in his extensive writings, proposed a device for accurately illustrating a perspective view, meant to capture an artist's certain "perspective" of a subject, by painting on a transparent screen interposed between the eye of the artist and the scene to be painted. In addition, a fixed eyepiece is typically mounted to the device in order to maintain a consistent viewpoint so that the artist can bring out a perspective of the subject or scenery. Such devices allow not only easy capturing of the visual features, but also enable the artist to bring out his or her own unique visual perspective to the work.

FIG. 1 is an example of a prior art linear perspective drawing aid and teaching apparatus 10 based on Leonardo's perspective. Apparatus 10 includes a base 12 that also serves as a storage container for the apparatus 10 when not in use. More particularly, base 12 includes a main storage area 14 in which user-artists can store supplies 16 such as pens, pencils, ink, tube paint and other artist tools to be used with is the invention. Adjacent storage area 14 towards the rear of base 12 is window support area 18 having a plurality of parallel slots 20 extending laterally across such area. As shown in FIG. 1, slots 20 are dimensioned to receive the bottom edge of rigid transparent sheet 22 to support sheet 22 in a generally vertical or upright position. A locking means such as pin 21 extending into an opening in a side surface 25 of base 12 may also be provided to secure the bottom edge of sheet 22 in slot 20, which sheet is preferably made of glass or Plexiglas®, or another suitable material.

Also provided along the front edge 24 of container 12 is a slot 26 for receiving the bottom edge of a second rigid transparent sheet 28 to secure sheet 28 in a substantially upright or vertical position as shown in FIG. 1. Alternatively, sheet 28 may be pivotably secured to container 12 along front edge 24 and movable between a storage position in storage area 16 and a use position. Cutouts 30 and 32 are provided along the side edges of sheet 28 to accommodate the user's arms, and aperture 34 through which the user views object O to be drawn or traced is centrally located in sheet 28, with chin rest 36 positioned just below aperture 34. In using device 10 to draw or trace object O on window 22, the user-artist will move to a position in front of sheet 28 so that he or she is looking through aperture 34 and window 22 in the direction of object O. In order to obtain a proper perspective, it is important that the user-artist keep his or her head as stationary as possible, and aperture 34 therefore serves a stationary reference point. Sheet 28, which could be a solid color so that the artist is viewing object O through aperture 34 with a single eye, should be positioned a distance away from the front is surface of window 22 equal to about two-thirds of the individual user's arm length, or on average about 16 to 18 inches. Window 22 therefore will be secured in one of slots 20 that is a comfortable distance from sheet 28 for the user. Then, using a suitable writing or drawing implement, the user-artist will trace or draw the object O on the surface of window 22 or on a cellophane paper or other thin transparent or translucent sheet placed over window 22 and secured by a clip or other means. Imaginary perspective lines 38 with respect to object O including horizontal and orthogonal lines converging at a vanishing point near aperture 34, which lines the artist of course does not see but may draw and which exist as conceptual principles of physics and mathematics, are also shown in FIG. 1. More experienced artists may prefer using apparatus 10 without sheet 28; however, sheet 28 should be used by young or novice artists, and the sheet is a desirable aid for individuals who are physically or emotionally handicapped such that the handicap interferes with eye, head and/or hand coordination. When a drawing is finished, window 22 and sheet 28 are placed flat in base 12, and a lid is preferably secured over base 12 for easy storage and transport of the apparatus 10.

While manual linear perspective drawing aids such as the one described above are useful for their particular purposes, they suffer from numerous drawbacks and inefficiencies. For example, the artist still must purchase and carry around conventional drawing implements and supplies such as pens, pencils, brushes, paints, and the like, which implements are expensive, messy, and prone to being lost or damaged. In addition, if the perspective is drawn on a glass, the glass must then be removed from is the holding apparatus and the drawing either transferred to a paper or canvas, or placed in a new frame, all of which is also inconvenient and time consuming. Furthermore, when known prior art linear perspective drawing aids are used as a practice device, the user-artist may wish to start over several times, requiring the paint or drawing to be either wiped off the glass several times, a new glass inserted, or a transparent paper or sheet must be changed. There is thus a need for an improved drawing tool that will help artists to focus on developing the skills and the artistic aspects, without interference from the limitations of the tools and artifacts.

Today's advances in electronics, computers, Internet and information technologies have revolutionized and affected deeply all aspects of life, including the visual art and drawing world. There are now various electronic painting and drawing tools available, such as by drawing using a stylus in combination with a touch sensitive display screen, or drawing on a separate touch sensitive screen whereby the image is transferred electronically and displayed on a display monitor. Nevertheless, as far as the present inventor is aware, no one has attempted or thought to provide a truly electronic version of a perspective drawing aid and teaching apparatus incorporating a transparent screen such as Leonardo's. U.S. Pat. No. 6,751,878 issued to Hamann discloses a device for creating three-dimensional drawings which he indicates can be accomplished either manually or electronically. However, Hamann does not explain how to accomplish a true electronic linear perspective drawing apparatus, other than that the device could communicate with a computer and the user could draw on a is "sensitive" "picture plane". The present inventor has quite unexpectedly discovered, however, an arrangement wherein a transparent electronic display screen can be used to provide a truly electronic version of Leonardo's perspective drawing apparatus.

OBJECTS OF THE INVENTION

It is therefore an object of the present invention to provide an electronic linear perspective drawing device and system for use by artists, engineers, students and other including a transparent electronic display screen, a suitable drawing input device, as well as a computer system having suitable software loaded, wherein the transparent electronic display screen is interposed between the three-dimensional scene to be painted or traced and the eye of the artist, and whereby the input device is used to digitally paint the three-dimensional scene on the flat display screen or an overlay as viewed by the user-artist looking through said transparent screen.

It is a further object of the invention to provide an electronic graphic arts system wherein the drawing input device is a stylus or digital pen used in combination with a transparent touch screen secured over a transparent display screen for painting or drawing linear perspectives.

It is a still further object of the present invention to provide an electronic drawing system wherein the user drawing input device is a haptic device used to draw or paint a scene on a transparent electronic screen interposed between the scene and the eye of the artist.

It is a still further object of the present invention to provide a standalone, portable electronic perspective drawing apparatus.

Additional objects, advantages and uses of the invention will become evident from reference to the description of the invention and the attached drawing figures.

DESCRIPTION OF THE PREFERRED EMBODIMENTS

The following detailed description is of the best mode or modes of the invention presently contemplated. Such description is not intended to be understood in a limiting sense, but to be an example of the invention presented solely for illustration thereof, and by reference to which in connection with the following description and the accompanying drawings one skilled in the art may be advised of the advantages and construction of the invention. Whenever possible, the same reference numbers will be used throughout the drawings to refer to the same or like parts.

The present invention is as far as the present inventor is aware the first truly electronic linear perspective drawing device, in which an electronic transparent screen is interposed between a three-dimensional object or scene and the eye of the artist, and which screen also serves as a perspective window through which the artist can view the object or scene, as well as the canvas on which a flat perspective drawing of the object is or scene is traced, drawn or painted. The artist's drawing or tracing strokes can be made directly on the electronic canvas using a stylus or pen, or another user interface device such as a haptic device in combination with a suitable electronic drawing program and computer system for capturing and saving the artwork created. Such device replaces the conventional paper or fabric art canvas and other manual linear perspective drawing devices, as well as conventional drawing tools and materials such as pencil, pen, brush, paint, etc., and their messy, cumbersome side effects including paint spills, blobs, cleaning paintbrushes and like artifacts. Further, the ability to instantaneously display the created electronic linear perspective image over the same transparent screen, exactly in the same position, greatly enhances the experience of creating art for both the novice and professional artist.

Figure 2:
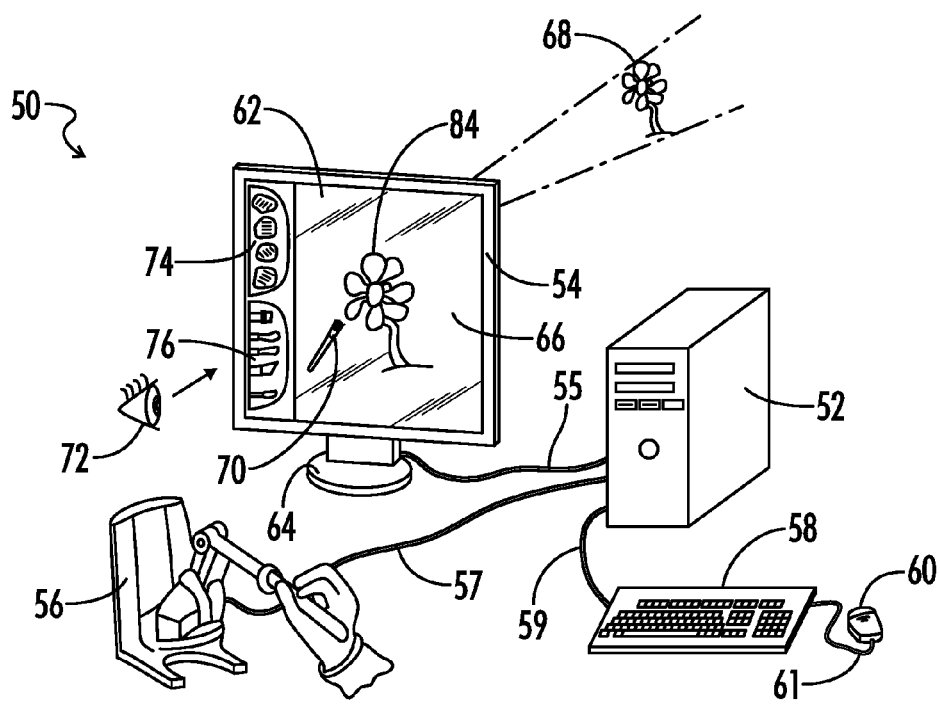
FIG. 2 is a pictorial view of a computer system which may be utilized to implement the electronic linear perspective drawing system of the present invention.

Turning now to FIG. 2, a first preferred embodiment of an electronic linear perspective drawing tool and system 50 in accordance with the present invention is shown. Drawing tool 50 is implemented using a computer 52, which may be either a stand-alone or networked computer system such as a desktop or workstation computer having sufficient computer processing capability for running a graphic image processing program in real time. Computer 52 includes a processor, and a dual-processor Pentium III PC with NVIDIA's GeForce2 graphics card or faster processing system is a suitable base system. Also included are display screen 54, user drawing interface device 56, keyboard 58 and mouse 60. Other peripheral devices such as a CD drive, printer, network card, and the like may be included with computer 52. Display screen 54 is is coupled to computer 52 by cable 55, user drawing interface 56 is coupled to computer 52 by cable 57, keyboard 58 is coupled to computer 52 by cable 59, and mouse 60 is coupled to keyboard 58 and computer 52 by cable 61, in combination with the appropriate control devices which are known to those skilled in the art. Such connections may also be made wireless via an infrared or radio frequency link utilizing communication techniques well known to those skilled in the art.

Display screen 54 has a substantially transparent screen area 62, and is an organic electroluminescent display device, and more particularly is a transparent organic light-emitting diode (TOLED) display. A support or base 64 for maintaining screen 54 in an upright position is also preferably included. Transparent OLED (TOLED) screens are commercially available, such as from Universal Display Corporation of Ewing, N.J. TOLED displays are transparent except for the areas of the display that are energized and actively showing images. A TOLED display structure typically includes a transparent substrate, a transparent conductive hole-injecting electrode, an organic hole-transporting layer, an inorganic light-emitting layer, an organic electron-transporting layer and an electron-injecting electrode or cathode consisting of a metal having a low work function. The TOLED display is constructed on a transparent substrate through which the light emitted by the device can be viewed by converting electric energy into light energy. Organic luminescent materials in a TOLED display when sandwiched between electrodes and subjected to a DC electric current is produce intense light and a variety of colors, which are combined into pixels that make up the display.

Drawing interface 56 in the presently described embodiment and as shown in FIG. 2 is preferably a haptic device, such as the Phantom desktop haptic device available from SensAble Technologies of Woburn, Mass. Haptic device 56 gives the artist-user a great deal of precision and control while painting or drawing in the manner described below. A software drawing application 61 (see FIG. 3) is also provided, and is preferably stored within the memory of computer 52 and executed within its central processing unit. A preferred software application is the DAB interactive haptic painting system designed by the University of North Carolina at Chapel Hill Department of Computer Science, described in detail at the Internet address http://gamma.cs.unc.edu/dab/, which system utilizes a 3D deformable brush model. As is illustrated in FIG. 2, a user-artist using system 50 can create linear perspective drawings of objects or scenes such as flower 68 directly on virtual canvas 66 formed by transparent area 62 of TOLED display 54, using a virtual paint brush 70 the brush strokes of which may be precisely controlled by the artist using haptic device 56. TOLED screen 54 is interposed between flower 68 and the artist's eye 72 such that the artist can see flower 68 through an electronic "window", and then can trace, draw, or paint directly on such "window" comprising TOLED screen 54. Using the DAB program, colors can be mixed and selected from a virtual palette 74, and paint brushes of is different sizes and shapes can be selected from virtual paint brush menu 76 using mouse 60 and keyboard 58.

Figure 3:
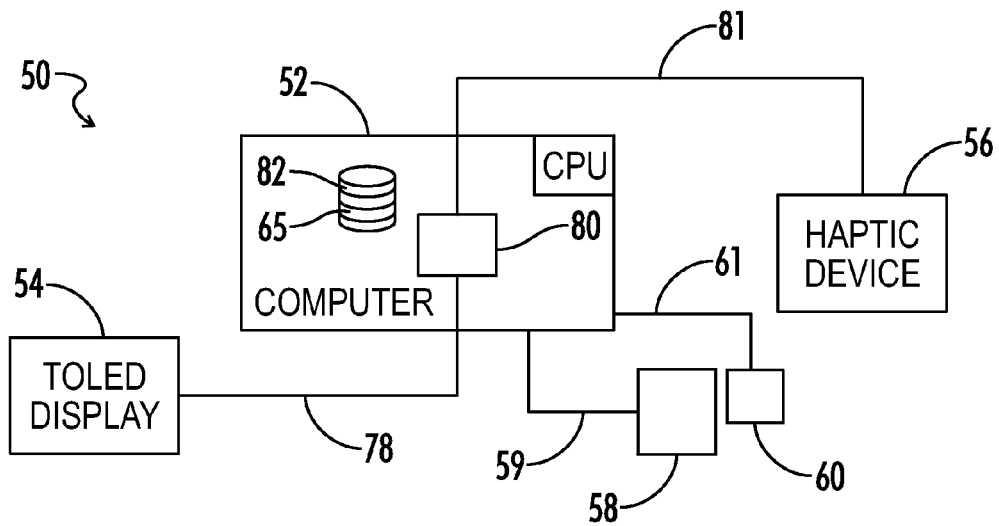
FIG. 3 is a high level block diagram of several components of the system pictured in FIG. 2.

Organic light-emitting diode (OLED) display screens are becoming more widely used in computer displays, television screens, cell phone and PDS screens, and to display basic information such as the time or temperature, or for advertising displays. Potential commercial uses of TOLED screens include automobile windshield warning systems and heads-up display systems in helmets and the like such as for industrial or medical applications. No one has previously understood the possibility of using TOLED screen technology to provide a transparent linear perspective drawing canvas on which true perspective drawings or painting could be made by artists in the manner described herein. Referring now to FIG. 3, there is depicted a block diagram which illustrates selected components that may be included with tool or system 50 shown in FIG. 2 in accordance with the teachings of the present invention. As depicted, system 50 is preferably controlled primarily by computer-readable instructions, which may be in the form of software stored and accessible by computer 52 and executable within the central processing unit (CPU) of computer 50 to cause computer 50 to do work. Electrical power and signal information can be supplied to TOLED display 54 by cable 78, and controller 80 in computer 52 may be in communication with TOLED display 54 through cable 78. Haptic device 56 may be connected to controller 80 by cable 81 typically via a parallel port, and device 56 may be manually operated so that in is combination with the software application 65 which is preferably stored on hard drive 82 of computer 52 virtual brush 70 may be used to generate a visual output on TOLED display 54. Such visual output is essentially the artist's rendition of the perspective of flower or scene 68 as it appears when viewed through TOLED display 54 (see FIG. 2) and may include lines, colors, shades, text, graphics and the like generated by known display controller technology which is then used to store in the memory of computer 52 using keyboard 58 or mouse 60 a pattern of bits corresponding to the image that is drawn or painted on display 54.

Figure 4:
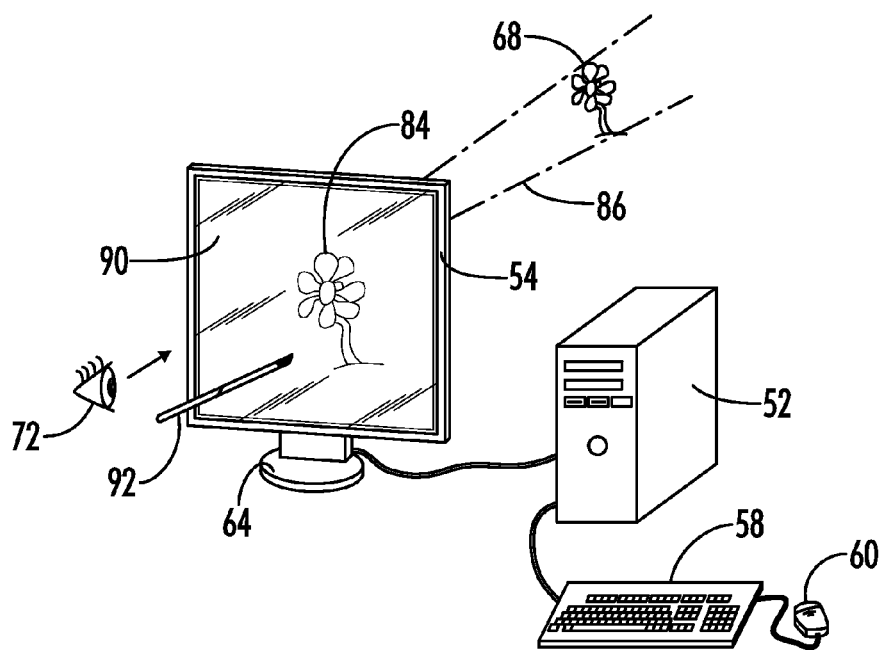
FIG. 4 is a pictorial view of an alternative linear perspective computer drawing system in accordance with the present invention.

FIG. 4 illustrates another embodiment of the electronic perspective drawing system of the present invention, wherein instead of drawing on TOLED display screen 54 using a haptic interface device 56 as described with reference to FIGS. 2-3 above, a transparent touch screen apparatus 90 is overlayed on TOLED screen 54. Touch screen apparatus 90 may be a surface acoustic wave touch screen apparatus, such as an IntelliTouch® touch screen overlay available from Elo TouchSystems, Fremont, Calif. Alternatively, the touch screen apparatus 90 may be a resistive type touch screen apparatus, or another touch screen pressure sensitive input device of a type that does not require conductivity to establish the pressure being applied to the apparatus. Another suitable touch screen is the Magic Touch screen available from Keytec, Inc. In such arrangement, a stylus 92 is used as the input device to draw directly on touch screen apparatus 90. In addition, a suitable software application will be installed on hard drive 82 of computer 52, such as MSPAINT or equivalent software, which is used is to capture the drawings on the screen.

Figure 5:
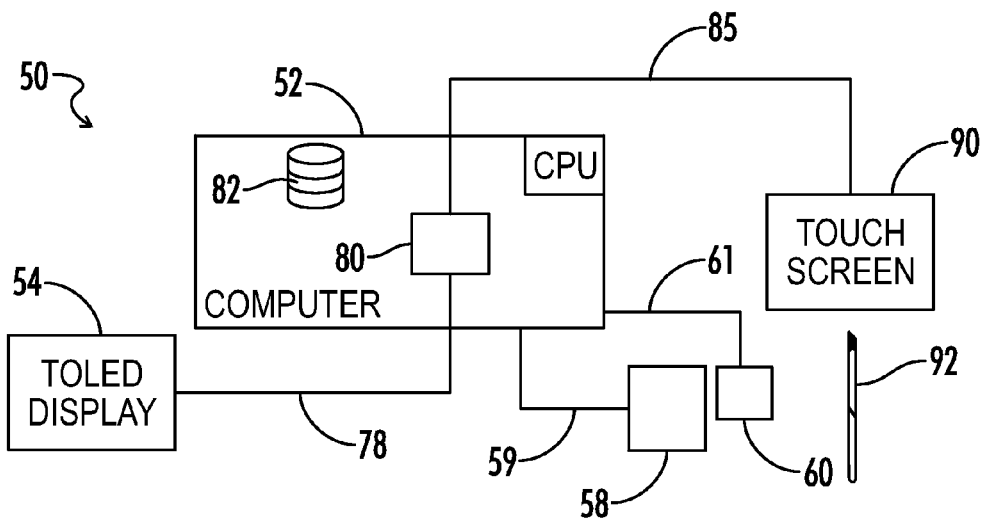
FIG. 5 is a high level block diagram of several of the components of the system pictured in FIG. 4.

As with the previously described embodiment, in use an artist will position his or her eye 72 in front of TOLED display 54 so that three-dimensional object or scene 68 is visible through the window formed by TOLED display 54 and overlay 90, with TOLED display 54 and overlay 90 also together serving as the drawing canvas on which such three-dimensional object or scene 68 is drawn on the flat surface of overlay 90. More particularly, a stylus 92 is used to trace or draw object or scene 68 directly on the flat surface of pressure sensitive touch screen overlay 90. Depending on the type of touch screen utilized, a different type of stylus may be necessary. For example, if a surface acoustic wave touch screen is utilized, a stylus having a vinyl tip or the like that will not scratch or damage the screen will be provided. While the horizontal and orthogonal lines and vanishing point that form the mathematical basis for creating a linear perspective drawing (see FIG. 1) are not shown in FIG. 4, orthogonal lines 86 illustrate how the edges of object or scene 68 connect on the overlay 90. Referring now to FIG. 5, electrical power and signal information may be supplied to TOLED display 54 by cable 78, and controller 80 in computer 52 may be in communication with TOLED display 54 through cable 78. Touch screen device 90 is also operably connected to controller 80, and stylus 92 when its tip is brought into contact touch screen overlay 92 create markings 84 on TOLED display 54 (see FIG. 4), which markings 84 are of course the artist's linear perspective drawing or rendition of scene 68 as it appears through TOLED display 54. Known display controller technology may be used to store in the is memory of computer 52 a pattern of bits corresponding to the image that is drawn or painted on display 54.

Figure 6:
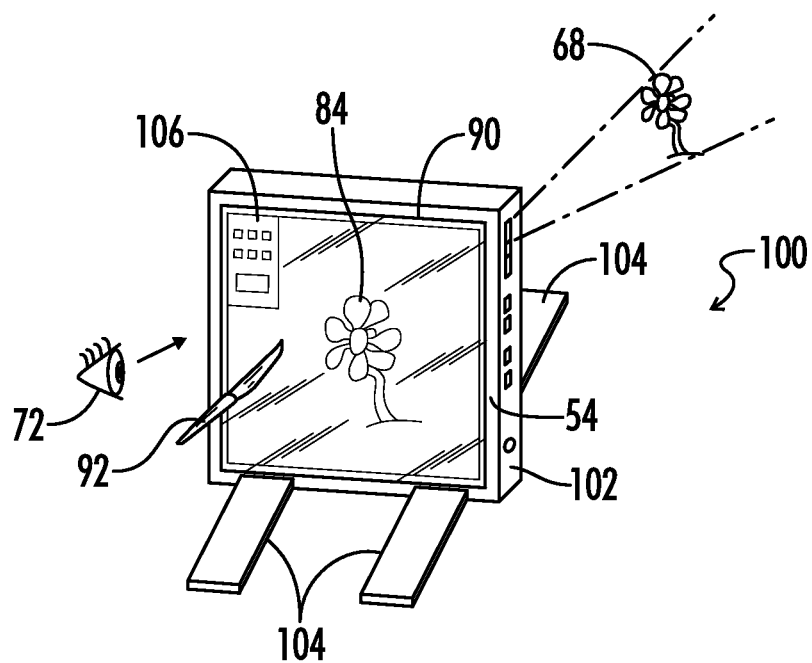
FIG. 6 is a pictorial view of another alternative electronic linear perspective drawing aid and system in accordance with the present invention.

FIG. 6 illustrates another embodiment of the electronic linear perspective drawing device shown of the present invention wherein such device 100 has been modified to be a portable, stand-alone product, with the computer system and all of the necessary electronics embedded in the frame 102 around the screen of such device. Support legs 104 or another suitable base structure is provided to enable device 100 to be supported and used in various environments, while a touch menu 106 on TOLED screen 54 is provided to perform various operations using device 100. As has already been described in detail with respect to the embodiment shown in FIGS. 4-5, stylus 92 is pressed against the surface of overlay 90 and a perspective drawing of object or scene 68 viewed by the artist 72 through transparent OLED screen 54 is created, which scene is then stored in the memory of computer 52 as a pattern of bits corresponding to the image that is drawn or painted on display 54.

Figure 1:
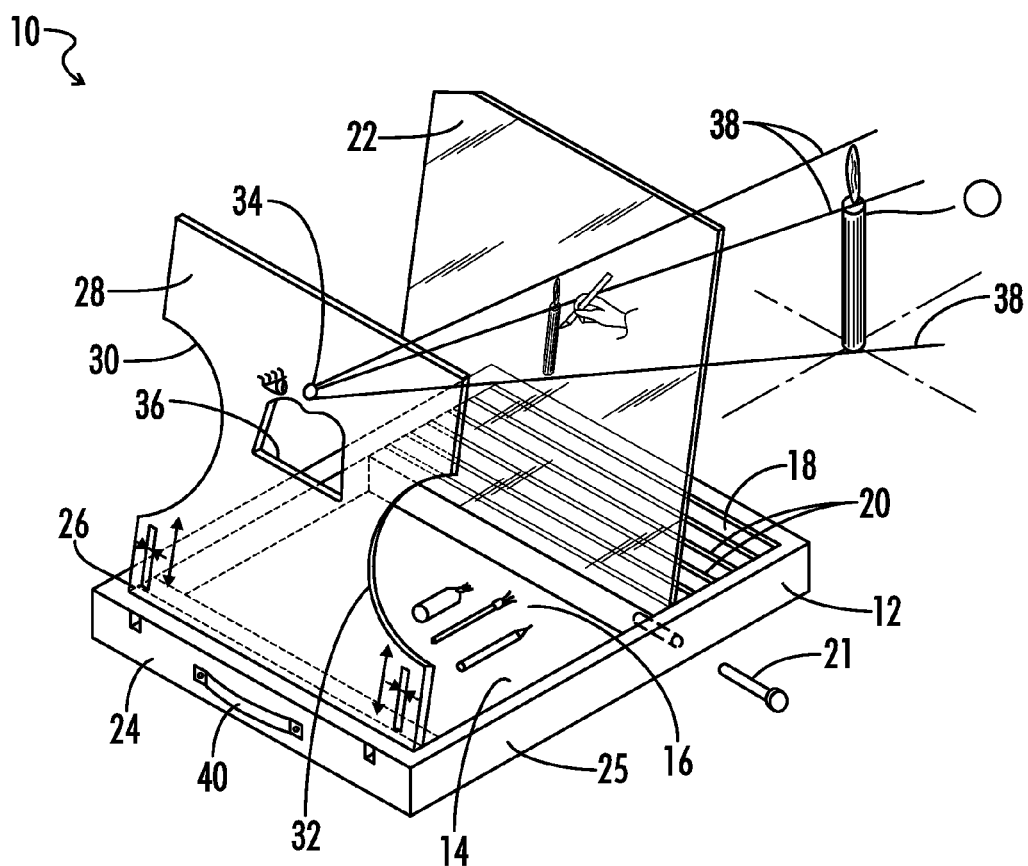
FIG. 1 is a pictorial view of a prior art manual perspective drawing device.

While several embodiments for creating an electronic perspective drawing tool or device have been described, other possible arrangements for creating such a drawing tool for artists and the like are possible. For example, the haptic device used in the embodiment shown with respect to FIGS. 2-3 may be utilized in the embodiment shown in FIG. 6 in place of the touch screen overlay and stylus. In addition, an eye positioning is device or fixed eyepiece such as shown in FIG. 1 may be combined with the device to aid the user-artist in maintaining a consistent viewpoint while viewing a scene or object through the TOLED display screen and then drawing such three-dimensional object on the flat screen surface or overlay. In another possible alternative embodiment, an ordinary transparent (glass or acrylic) screen can be mounted and fitted in a frame. A transparency may then be overlaid on the screen, and a perspective drawing may be drawn on the transparency. Rather than using a TOLED screen to electronically capture the image, an electronic digital stylus or pen that can capture such image may be utilized when creating the perspective drawing. The stylus or pen may be a visual camera based digital pen, such as the io2 Digital Pen available from Logitech, and which pens use special electronics and a camera embedded within the pen to capture drawing strokes as they are made for later transfer to a computer via a USB port or the like of a type well known to those of ordinary skill in the art. A specially marked grid would also be placed on the drawing surface of such transparency to serve as a reference point in using such stylus or pen. Alternatively, a sonic based digital pen may be employed as the input device. One such input device is a pen is available from EPOS Development Ltd. located in Israel, which pen employs a sonic transmitter that is retrofitted inside an ordinary pen/stylus, and a receiver placed in the proximity then captures the ultrasonic signal. The digitized image is then stored in the pen's memory, and a USB port for plugging into a computer to download and/or print is also provided.

Figure 7:
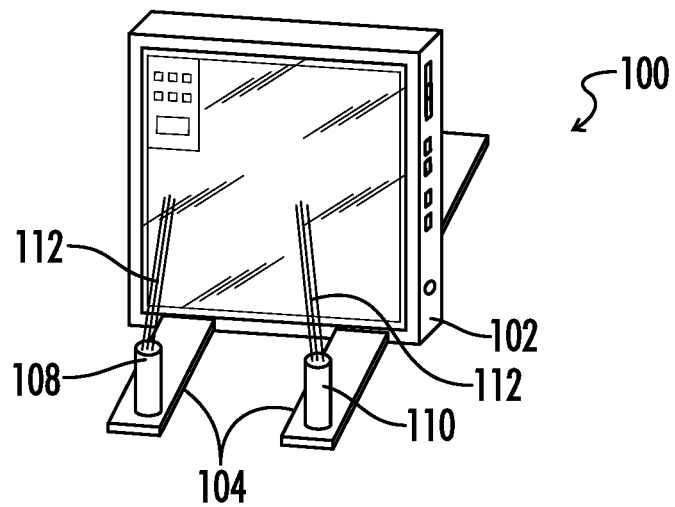
FIG. 7 illustrates an eye position guide arrangement for use with the present invention.

As will be evident from FIG. 1, when using the principle of Leonardo's is perspective principle, it will be necessary for the artist to hold his or her head steady or in one place while tracing the image on the screen in accordance with the invention. Otherwise, the perspective drawing will be distorted. There are several ways to accomplish a stable view including the use of headrests such as shown in FIG. 1 or by actual head clamps or helmets holding the head steady or in one place. Another expedient, however, is to have preferably a pair of light tubes 108 and 110 such as shown in FIG. 7 on the outer ends of support legs 104 which can be adjusted to shine low intensity light beams 112 toward or past the artist's eyes. Such lights are dispensed out of narrow tubes toward and into the peripheral portion of the artist's eyes. As long as the light is detected the artist may be assured that his or her eyes are viewing the object or scene being copied from the same position, but if one or both lights disappear, the artist will know his or her view has shifted and will stop tracing the view and move his or her head until a clear view of such lights is reestablished. With a little practice the artist will learn to automatically keep the lights in view. The depth and diameter of the light tubes will determine how sensitive the positioning apparatus is, and may be adjustable. Since the light is shown in the artists eyes preferably either from the side or from below as shown in FIG. 7 and is low intensity it does not either harm or distract the artist's eyes from careful observation of the object being drawn. Means can be devised for accurate measuring and positioning the eye steadiness light means in an effective position.

The electronic perspective drawing device of the present invention can be used is by professional artists as well as by hobby amateur artists, and in addition can be used as an aid or tool for teaching artists proper perspective drawing techniques. In addition, the device also could be used by mental rehabilitation centers with patients as part of their rehabilitation regimen or exercises, or by convalescence and senior centers as a recreational or creative hobby tool. Other persons having a limited ability to handle conventional manual paint canvas and paints would also benefit from the present device. The device can also be employed in scientific optical instrumentation, and there are also many potential uses in engineering, architectural designing to capture artistic perspective features, or in virtually any scenario where creation of a manual drawing is required by engineers and others. In other words, while all of the exact uses may be unknown at this time, many possibilities exist. For example, laser based experiments may also be complemented with such a screen, and in another embodiment, the electronic perspective drawing device could be customized for use as a stargazing and star mapping and learning device when viewing night sky and stars through the device. The device could be used to trace imaginary lines connecting stars and galaxies in forming the constellations. In addition, such device would be very useful to trace and track stars, planets, galaxies, and constellations. Stored images of constellations could be instantaneously displayed and compared with actual night sky, and overall would likely make practical astronomy significantly more attractive for amateurs.

Other possibilities for use of the electronic perspective drawing device include an instantaneous perspective of visual stereo imaging. With the addition of a proper is eyepiece frame, users could view stereo images and photographs, and contour imaging of 3D images. Other potential applications lie in the emerging area of hologram displays with or without lasers, wherein a transparent screen can be nicely complemented to provide a perspective to 3D imaging. Such device may also be usable to create and assemble instant animations using free-hand drawing, painting, and combine with stored images. In a portable, lightweight version of the device, it can be carried along separate from a cumbersome computer or heavy laptop.

While the present invention has been described at some length and with some particularly with respect to the several described embodiments, it is not intended that it should be limited to any such particulars or embodiments or any particular embodiment, but it is to be construed with references to the appended claims so as to provide the broadest possible interpretation of such claims in view of the prior art and, therefore, to effectively encompass the intended scope of the invention.

I claim:

1. An electronic linear perspective drawing tool comprising:
    (a) an electronic transparent drawing canvas which is interposed at substantially a right angle between a three-dimensional object or scene to be drawn and the eye of an artist such that the object or scene can be traced on said canvas;
    (b) a user interface apparatus for drawing on said electronic drawing canvas;
    (c) computer means operably connected to said drawing canvas and user interface apparatus having a computer memory for storing inputs made on said electronic drawing canvas using the user interface apparatus; and (d) a software drawing application stored in said computer memory.

2. The electronic linear perspective drawing tool as claimed in claim 1 in which the said user drawing interface apparatus is a haptic device operably connected to said computer whereby by operating the haptic device in combination with said software drawing application the object or scene may be drawn on the electronic drawing canvas and then stored in the computer memory.

3. The electronic linear perspective drawing tool as claimed in claim 2 in which the software executing on the computer system interprets the movements of said haptic device as being a digital paintbrush the drawing strokes of which appear on electronic drawing canvas.

4. The electronic linear perspective drawing tool as claimed in claim 3 additionally comprising a means for selecting different paint colors and brush styles.

5. The electronic linear perspective drawing tool as claimed in claim 1 in which said electronic drawing canvas is a transparent organic light-emitting diode (TOLED) display.

6. The electronic linear perspective drawing tool as claimed in claim 1 additionally comprising a transparent pressure sensitive touch screen overlaid on and operably connected to said electronic drawing canvas, and a stylus which when brought into contact with the surface of said pressure sensitive touch screen transfers a drawing input on to the electronic drawing canvas.

7. The electronic linear perspective drawing tool as claimed in claim 1 in which said system is a standalone system and is portable.

8. A method of creating linear perspective drawings electronically using a computer drawing or painting system including a transparent organic light-emitting diode (TOLED) display and a user interface device, the method comprising:

(a) positioning the TOLED display so that it is interposed at substantially a right angle between a three-dimensional scene to be drawn or painted and the eye of the artist;

(b) looking through the transparent display screen at the scene to be drawn and manually operating said user interface to create an electronic perspective drawing of the scene on the TOLED display; and (c) saving the electronic perspective drawing on the hard drive of said computer system.

9. The method of claim 8 in which the user interface device is a haptic device, and further including drawing software stored on the computer system whereby upon the step of creating the electronic perspective drawing the haptic device is operated by the artist which executes the software enabling the user to manipulate a virtual stylus on the TOLED screen to making drawing strokes required to create said electronic perspective drawing.

10. The method of claim 9 in which the drawing software includes a virtual paint brush and color palette feature, whereby the virtual paint brush is manipulated on the TOLED screen to generate images of brush strokes made by the digital paint brush in tracing or painting the perspective drawing.

11. The method of claim 10 whereby the haptic device is operated to select a desired paint brush and color for use in said electronic perspective drawing.

12. The method of claim 8, further including a pressure sensitive touch screen operably secured over the TOLED screen, and wherein said user interface device is a stylus which is brought into contact with the touch screen and manipulated by the artist to create said electronic linear perspective drawing.

\* \* \* \* \*